(12) United States Patent
Yoo

(10) Patent No.: US 7,544,395 B2
(45) Date of Patent: Jun. 9, 2009

(54) PATTERNING METHOD OF LIQUID CRYSTAL DISPLAY DEVICE

(75) Inventor: Hong Suk Yoo, Gunpo-si (KR)

(73) Assignee: LG Display Co., Ltd., Seoul (KR)

( * ) Notice: Subject to any disclaimer, the term of this patent is extended or adjusted under 35 U.S.C. 154(b) by 687 days.

(21) Appl. No.: 11/377,864

(22) Filed: Mar. 17, 2006

(65) Prior Publication Data

US 2006/0210720 A1 Sep. 21, 2006

(30) Foreign Application Priority Data

Mar. 17, 2005 (KR) .................. 10-2005-0022265

(51) Int. Cl.
*B05D 1/04* (2006.01)
*B05D 5/06* (2006.01)

(52) U.S. Cl. ...................... 427/466; 427/469

(58) Field of Classification Search ................. None
See application file for complete search history.

(56) References Cited

U.S. PATENT DOCUMENTS 5,041,843 A * 8/1991 Tohyama et al. ......... 346/140.1
5,191,834 A * 3/1993 Fuhrmann et al. ............ 101/130
5,279,224 A * 1/1994 Sprunger ...................... 101/465
5,555,809 A * 9/1996 Hirt et al. ..................... 101/451

* cited by examiner

*Primary Examiner*—Frederick J Parker
(74) *Attorney, Agent, or Firm*—McKenna Long & Aldridge LLP

(57) ABSTRACT

A patterning method of a liquid crystal display (LCD) device is disclosed, to prevent a pattern material from having a swelling portion when using a printing method, thereby obtaining preciseness in patterning, the patterning method including a first step for coating a pattern material containing charged particles on a printing roll having a blanket adhered thereto; a second step for rolling the printing roll on a printing plate having a plurality of projections for printing some pattern material on the projections of the printing plate and form a predetermined pattern on the blanket of the printing roll with the pattern material remaining on the blanket; and a third step for rolling the printing roll on a substrate to re-print the predetermined pattern of pattern material on the substrate, wherein the first step includes applying a voltage of the opposite polarity to the pattern material to the printing roll.

16 Claims, 4 Drawing Sheets

PATTERNING METHOD OF LIQUID CRYSTAL DISPLAY DEVICE

This application claims the benefit of Korean Patent Application No. P2005-22265, filed on Mar. 17, 2005, which is hereby incorporated by reference for all purposes as if fully set forth herein.

BACKGROUND OF THE INVENTION

1. Field of the Invention

The present invention relates to a liquid crystal display (LCD) device, and more particularly, to a patterning method of a liquid crystal display (LCD) device.

2. Discussion of the Related Art

Among various ultra-thin flat type display devices, which include devices having a display screen with a thickness of not more than a few centimeters, a liquid crystal display (LCD) device can be widely used for notebook computers, monitors, aircraft, etc. since it has advantages such as low power consumption and portability.

The LCD device includes lower and upper substrates facing each other at a predetermined interval therebetween, and a liquid crystal layer formed between the lower and upper substrates. Generally, the lower substrate includes a thin film transistor and a pixel electrode, and the upper substrate includes a black matrix layer, a color filter layer and a common electrode.

The LCD device includes various elements formed by repeated steps. In particular, photolithography may be used to form elements of various shapes. However, forming elements using photolithography requires the use a mask of a predetermined pattern and a photo-irradiation device. Accordingly, photolithography has the disadvantage of increasing manufacturing cost. In addition, photolithography requires complex exposure and development processes increasing the time required for manufacturing LCD devices.

To overcome the problems associated with photolithography, alternative patterning methods such as printing methods are used.

In a printing method, a predetermined material is coated in a desired pattern on a printing roll. By rolling the printing roll on a substrate, the predetermined material of the desired pattern is printed on the substrate. Printing methods employ physical contact between the printing roll and the substrate, which can restrict the applicability of the printing method. In spite of the theses disadvantages, printing methods having various modifications are used because the printing method is simple and advantageous to the mass production of liquid crystal devices.

Hereinafter, a related art printing method will be described with reference to FIGS. 1A to 1C.

FIGS. 1A to 1C are schematic views illustrating a related art printing method.

As shown in FIG. 1A, a pattern material 20 is supplied through a printing nozzle 10, and is coated onto a printing roll 30. The printing roll includes a blanket 35 that adheres to the printing roll 30. The pattern material 20 is coated onto the printing roll blanket 35.

Referring to FIG. 1B, as the printing roll 30 rolls on a printing plate 40 having a plurality of projections 45 of predetermined shape, some of the pattern material 20a is printed on the projections 45 of the printing plate 40, leaving remaining pattern material 20b formed on the blanket 35 of the printing roll 30.

As shown in FIG. 1C, the remaining pattern material 20b is printed on the substrate 50 by rolling the printing roll 30 on the substrate 50.

When the related art printing method is used, problems associated with the blanket 35 adhering to the printing roll 30 may interfere with precisely forming a required pattern on the substrate 50.

Forming precise patterns requires that the blanket 35 have good adherence to the printing roll 30, and that the blanket not exhibit deformation during the printing process. The blanket should also exhibit adequate elasticity during the printing of the pattern material to the substrate 50.

The blanket may be formed of Si-based resin. However, Si-based resin has a low surface tension. The low surface tension of the Si-based resin may result in the pattern material 20 having a swelling portion as shown in 'A' of FIG. 1A. The swelling portion 'A' of the pattern material interferes with obtaining precise patterns using the printing method of the related art.

SUMMARY OF THE INVENTION

Accordingly, the present invention is directed to a patterning method of a liquid crystal display (LCD) device that substantially obviates one or more problems due to limitations and disadvantages of the related art.

An advantage of the present invention is to provide a patterning method of a liquid crystal display (LCD) device, to prevent a pattern material from having a swelling portion when using a printing method, thereby obtaining preciseness in patterning.

Additional features and advantages of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, a patterning method includes a first step for coating a pattern material containing charged particles onto a printing roll having a blanket adhered thereto wherein the charged particles give the pattern material a polarity; a second step for rolling the printing roll on a printing plate having a plurality of projections to print some pattern material onto the projections of the printing plate and leaving remaining pattern material on the blanket to form a predetermined pattern on the blanket of the printing roll with the remaining pattern material; and a third step for rolling the printing roll on a substrate to re-print the predetermined pattern of pattern material onto the substrate, wherein the first step includes applying a voltage to the printing roll having a polarity opposite to the pattern material.

In another aspect of the present invention, a patterning method includes a first step for coating a pattern material containing charged particles in a plurality of recesses of a printing plate wherein the charged particles give the pattern material a polarity; a second step for rolling a printing roll having a blanket adhered thereto on the printing plate to print the pattern material formed in the plurality of recesses onto the printing roll to form a predetermined pattern of the pattern material on the printing roll; and a third step for rolling the printing roll on a substrate to re-print the predetermined pattern of the printing roll onto the substrate, wherein the second step includes applying a voltage to the printing roll having a polarity opposite to the pattern material.

In another aspect of the present invention, a patterning method includes a first step for coating a pattern material containing charged particles on a printing plate wherein the charged particles give the pattern material a polarity; a second step for rolling a printing roll having a plurality of projections and a blanket adhered thereto on the printing plate having the pattern material to form a predetermined shape of the pattern material on the printing roll by printing some pattern material onto the blanket over the projections; and a third step for rolling the printing roll on a substrate to re-print the predetermined shape of the pattern material onto the substrate, wherein the second step includes applying a voltage to the printing roll having a polarity opposite to the pattern material.

In another aspect of the present invention, a patterning method includes a first step for coating a pattern material containing charged particles on a printing roll having a blanket adhered thereto, wherein the charged particles give the pattern material a polarity, and wherein a voltage of the opposite polarity to the pattern material is applied to the printing roll; a second step for rolling the printing roll on a printing plate having a plurality of projections to print some of the pattern material onto the projections of the printing plate and leaving remaining pattern material on the blanket to form a predetermined pattern on the blanket of the printing roll with the remaining pattern material, wherein a voltage of the same polarity as the pattern material is applied to the printing roll, and a voltage of the opposite polarity to the pattern material is applied to the printing plate; and a third step for rolling the printing roll on a substrate to re-print the predetermined pattern of pattern material onto the substrate, wherein a voltage of the same polarity as the pattern material is applied to the printing roll, and a voltage of the opposite polarity to the pattern material is applied to the substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, the same reference numbers will be used throughout the drawings to refer to the same or like parts.

Hereinafter, a patterning method of a liquid crystal display (LCD) device according to the present invention will be described with reference to the accompanying drawings.

The patterning method is described herein as being used with a pattern material containing positively (+) charged particles giving the pattern material a positive polarity. However, the pattern material may contain negatively (−) charged particles giving the pattern material a negative polarity. If the pattern material contains negatively (−) charged particles, each voltage applied to a printing roll, a printing plate and a substrate is opposite to each voltage applied thereto as described for the case of using the pattern material containing the positively (+) charged particles.

Figure 1A:
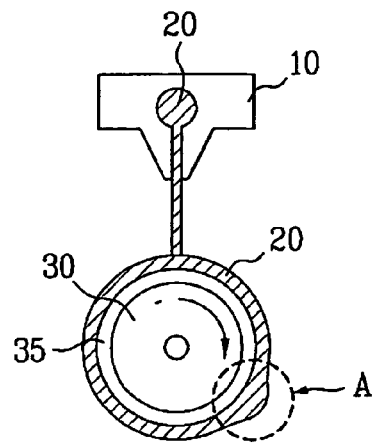
FIGS. 1A, 1B, and 1C are schematic views illustrating a related art printing method.
Figure 1B:
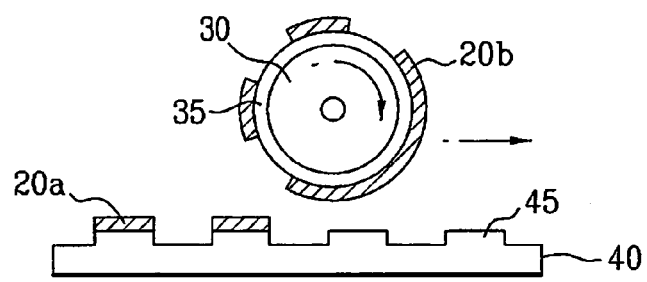
Figure 1C:
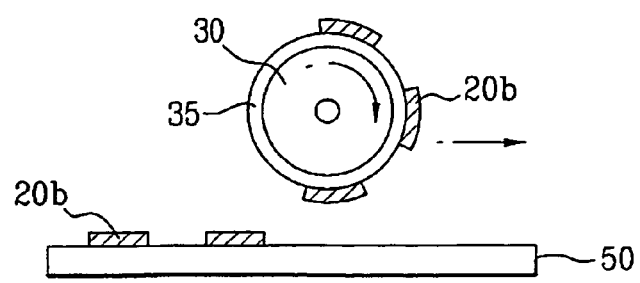
Figure 2A:
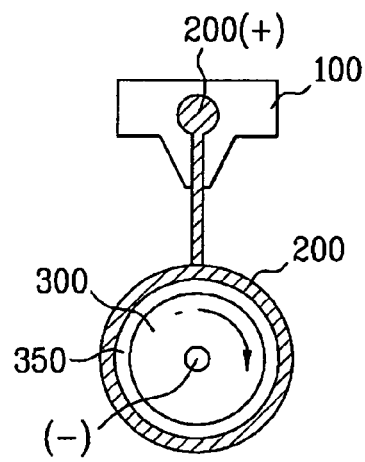
FIGS. 2A, 2B, and 2C are schematic views illustrating a patterning method according to a first embodiment of the present invention.
Figure 2B:
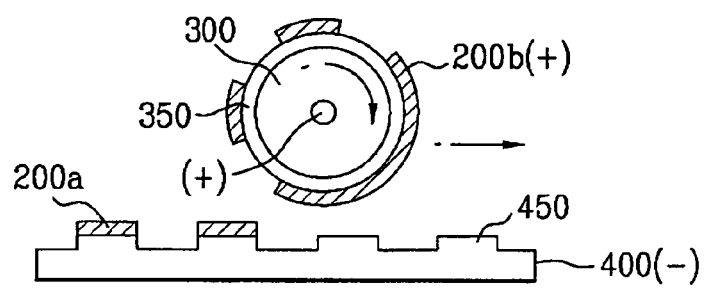
Figure 2C:
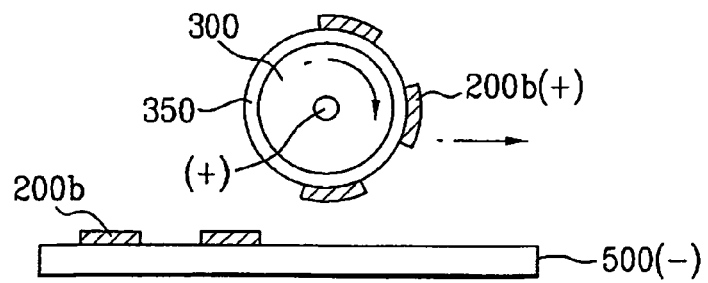

FIGS. 2A to 2C are schematic views illustrating a patterning method according to the first embodiment of the present invention.

As shown in FIG. 2A, a pattern material 200 is supplied through a printing nozzle 100, and is coated on a printing roll 300 having a blanket 350 adhered thereto. The pattern material 200 contains positive (+) charged particles giving the pattern material a positive polarity, and a negative (−) voltage is applied to the printing roll 300 giving the printing roll a negative polarity. That is, the particles of the pattern material are opposite in polarity to the voltage applied to the printing roll 300. Even though the blanket 350 adhered to the printing roll 300 has a small surface tension, the pattern material 200 is uniformly coated on the printing roll 300 without swelling owing to an attractive force generated between the pattern material 200 and the printing roll 300.

As shown in FIG. 2B, as the printing roll 300 rolls on a printing plate 400 having a plurality of projections 450 of predetermined shape, some pattern material 200a is printed onto the projections 450 of the printing plate 400, and a predetermined pattern 200b of the remaining pattern material is formed on the blanket 350 of the printing roll 300. The pattern material 200 contains the positive (+) charged particles giving the pattern material 200 a positive polarity, and a positive (+) voltage having the same polarity as the pattern material 200 is applied to the printing roll 300. The common polarity of the pattern material 200 and the printing roll 300 generates a repulsive force between the pattern material 200 and the printing roll 300, so that some of the pattern material 200a is well printed onto the projections 450 of the printing plate 400. A negative (−) voltage may be applied to the printing plate 400, to generate an attractive force between the printing plate 400 and the pattern material 200. The attractive force between the printing plate 400 and the pattern material 200 further contributes to the effective transfer of some of the pattern material 200a to the projections 450 of the printing plate 400.

As shown in FIG. 2C, by rolling the printing roll 300 on a substrate 500, the predetermined pattern 200b is re-printed onto the substrate 500. A positive (+) voltage having the same polarity as the pattern material 200 may be applied to the printing roll 300 to generate a repulsive force between the printing roll 300 and the pattern material 200b. The repulsive force results in the pattern material 200b being more effectively printed onto the substrate 500.

A negative (−) voltage having opposite polarity to that of the pattern material 200 may be applied to the substrate 500 to generate an attractive force between the substrate 500 and the pattern material 200b. The attractive force generated between the substrate 500 and the pattern material 200b due to their opposing polarities contributes to the precise printing of pattern material 200b from the printing roll 300 onto the substrate 500.

Figure 3A:
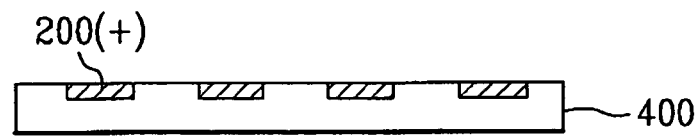
FIGS. 3A, 3B, and 3C are schematic views of illustrating a patterning method according to a second embodiment of the present invention.
Figure 3B:
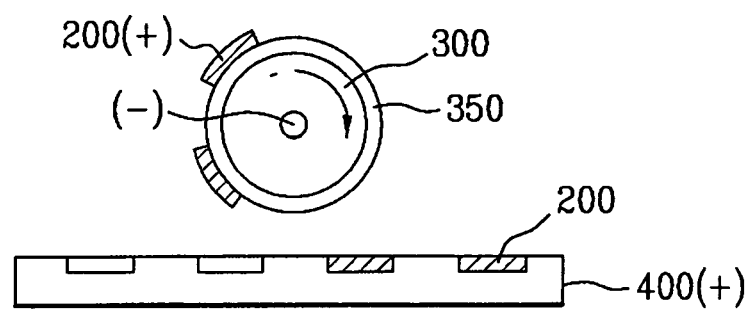
Figure 3C:
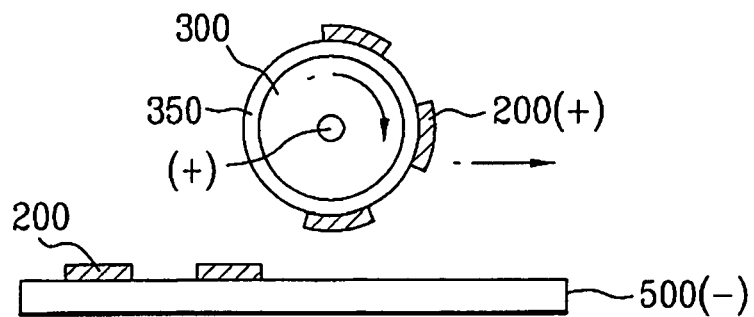

FIGS. 3A to 3C are schematic views illustrating a patterning method according to the second embodiment of the present invention.

As shown in FIG. 3A, a pattern material 200 is coated in a plurality of recesses of a printing plate 400. The pattern material 200 contains positive (+) charged particles giving the pattern material a positive polarity.

Then, as shown in FIG. 3B, as a printing roll 300 having a blanket 350 adhered thereto rolls on the printing plate 400, the pattern material 200 coated in the recesses of the printing plate 400 is printed onto the blanket 350 of the printing roll 300. Accordingly, a predetermined shape of the pattern material 200 is formed on the blanket 350 of the printing roll 300.

A negative (−) voltage having opposite polarity to the pattern material 200 may be applied to the printing roll 300 to generate an attractive force between the printing roll 300 and the pattern material 200. The pattern material 200 of the printing plate 400 is more effectively printed onto the printing roll 300 due to the attractive force between the printing roll 300 and the pattern material 200.

A positive (+) voltage having the same polarity as the pattern material 200 may be applied to the printing plate 400 to generate a repulsive force between the pattern material 200 and the printing plate 400. The pattern material 200 of the printing plate 400 is more effectively printed onto the printing roll 300 due to the repulsive force between the pattern material 200 and the printing plate 400.

After that, as shown in FIG. 3C, the printing roll 300 rolls on a substrate 500, whereby the pattern material 200 of the printing roll 300 is re-printed onto the substrate 500.

A positive (+) voltage having the same polarity as the pattern material 200 may be applied to the printing roll 300 to generate a repulsive force between the printing roll 300 and the pattern material 200. The pattern material 200 is more effectively printed onto the substrate 500 from the printing roll 300 due to the repulsive force between the printing roll 300 and the pattern material 200.

A negative (−) voltage having opposite polarity to the pattern material 200 is applied to the substrate 500 to generate an attractive force between the substrate 500 and the pattern material 200. The pattern material 200 is more effectively printed onto the substrate 500 from the printing roll 300 due to the attractive force between the substrate 500 and the pattern material 200.

Figure 4A:
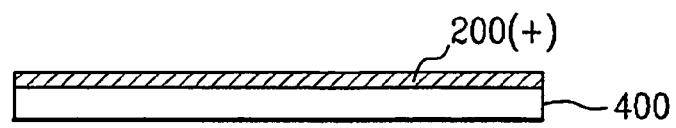
FIGS. 4A, 4B, and 4C are schematic views of illustrating a patterning method according to a third embodiment of the present invention.
Figure 4B:
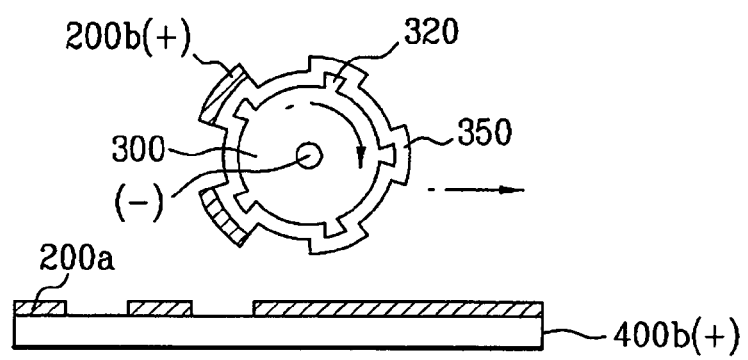
Figure 4C:
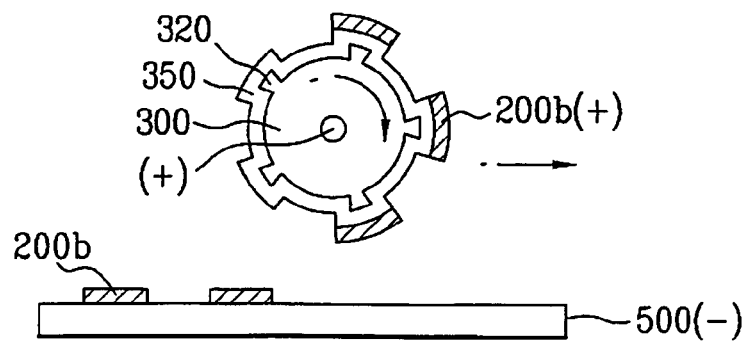

FIGS. 4A to 4C are schematic views illustrating a patterning method according to the third embodiment of the present invention.

As shown in FIG. 4A, a pattern material 200 is coated on a printing plate 400. The pattern material 200 contains positive (+) charged particles.

As shown in FIG. 4B, a plurality of projections 320 are formed on a printing roll 300 and a blanket 350 is adhered the printing roll. By rolling the printing roll 300 on the printing plate 400 having the pattern material 200 coated thereon, the pattern material 200 of the printing plate 400 is printed onto the blanket 350 over the projections 320, thereby forming a predetermined pattern 200b of the pattern material.

A negative (−) voltage having opposite polarity to the pattern material 200 is applied to the printing roll 300 to generate an attractive force between the printing roll 300 and the pattern material 200. The attractive force results in the pattern material 200 being more precisely printed onto the printing roll 300 from the printing plate 400.

A positive (+) voltage having the same polarity as the pattern material 200 may be applied to the printing plate 400 to generate a repulsive force between the printing plate 400 and the pattern material 200. That is, the repulsive force between the printing plate 400 and the pattern material 200 contributes to precise printing of pattern material from the printing plate 400 onto the printing roll 300.

Then, as shown in FIG. 4C, the pattern material 200b is printed on a substrate 500 by rolling the printing roll 300 on the substrate 500.

A positive (+) voltage having the same polarity as the pattern material 200 may be applied to the printing roll 300 to generate a repulsive force between the printing roll 300 and the pattern material. Also, a negative (−) voltage having opposite polarity to the pattern material 200 is applied to the substrate 500 to generate an attractive force between the pattern material 200 and the substrate 500. As a result of the attractive force, the pattern material 200 is more effectively printed onto the substrate 500 from the printing roll 300.

As mentioned above, the patterning method according to the present invention has the following advantages.

First, the pattern material contains the positive (+) or negative (−) charged particles, and the voltage of the opposite polarity to the pattern material is applied to the printing roll. Accordingly, even though there is the small surface tension of the blanket adhered to the printing roll, the pattern material is uniformly coated on the printing roll without swelling owing to the attractive force generated between the pattern material and the printing roll.

Also, the pattern material contains positive (+) or negative (−) charged particles, and a positive (+) or negative (−) voltage is selectively applied to the printing roll, the printing plate and the substrate, thereby improving the printing characteristics of pattern material through the respective attractive or repulsive forces generated between the pattern material and each of the printing roll, the printing plate and the substrate.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A patterning method comprising:
    a first step for coating a pattern material containing charged particles onto a printing roll having a blanket adhered thereto wherein the charged particles give the pattern material a polarity;
    a second step for rolling the printing roll on a printing plate having a plurality of projections to print some pattern material onto the projections of the printing plate and leaving remaining pattern material on the blanket to form a predetermined pattern on the blanket of the printing roll with the remaining pattern material; and
    a third step for rolling the printing roll on a substrate to re-print the predetermined pattern of pattern material onto the substrate,
    wherein the first step includes applying a voltage to the printing roll having a polarity opposite to the pattern material.

2. The method of claim 1, wherein the second step includes applying a voltage to the printing roll having the same polarity as the pattern material.

3. The method of claim 1, wherein the second step includes applying a voltage to the printing plate having the opposite polarity to the pattern material.

4. The method of claim 3, wherein the third step includes applying a voltage to the printing roll having the same polarity as the pattern material.

5. The method of claim 1, wherein the third step includes applying a voltage to the substrate having a polarity opposite to the pattern material.

6. A patterning method comprising:
a first step for coating a pattern material containing charged particles in a plurality of recesses of a printing plate wherein the charged particles give the pattern material a polarity;
a second step for rolling a printing roll having a blanket adhered thereto on the printing plate to print the pattern material formed in the plurality of recesses onto the printing roll to form a predetermined pattern of the pattern material on the printing roll; and
a third step for rolling the printing roll on a substrate to re-print the predetermined pattern of the printing roll onto the substrate,
wherein the second step includes applying a voltage to the printing roll having a polarity opposite to the pattern material.

7. The method of claim 6, wherein the second step includes applying a voltage to the printing plate having the same polarity as the pattern material.

8. The method of claim 6, wherein the third step includes applying a voltage to the printing roll having the same polarity as the pattern material.

9. The method of claim 6, wherein the third step includes applying a voltage to the substrate having a polarity opposite to the pattern material.

10. A patterning method comprising:
a first step for coating a pattern material containing charged particles on a printing plate wherein the charged particles give the pattern material a polarity;
a second step for rolling a printing roll having a plurality of projections and a blanket adhered thereto on the printing plate having the pattern material to form a predetermined shape of the pattern material on the printing roll by printing some pattern material onto the blanket over the projections; and
a third step for rolling the printing roll on a substrate to re-print the predetermined shape of the pattern material onto the substrate,
wherein the second step includes applying a voltage to the printing roll having a polarity opposite to the pattern material.

11. The method of claim 10, wherein the second step includes applying a voltage of the same polarity as the pattern material to the printing plate.

12. The method of claim 10, wherein the third step includes applying a voltage of the same polarity as the pattern material to the printing roll.

13. The method of claim 10, wherein the third step includes applying a voltage of a polarity opposite to the pattern material to the substrate.

14. A patterning method comprising:
a first step for coating a pattern material containing charged particles on a printing roll having a blanket adhered thereto, wherein the charged particles give the pattern material a polarity, and wherein a voltage of the opposite polarity to the pattern material is applied to the printing roll;
a second step for rolling the printing roll on a printing plate having a plurality of projections to print some of the pattern material onto the projections of the printing plate and leaving remaining pattern material on the blanket to form a predetermined pattern on the blanket of the printing roll with the remaining pattern material, wherein a voltage of the same polarity as the pattern material is applied to the printing roll, and a voltage of the opposite polarity to the pattern material is applied to the printing plate; and
a third step for rolling the printing roll on a substrate to re-print the predetermined pattern of pattern material onto the substrate, wherein a voltage of the same polarity as the pattern material is applied to the printing roll, and a voltage of the opposite polarity to the pattern material is applied to the substrate.

15. A patterning method comprising:
a first step for coating a pattern material containing charged particles in a plurality of recesses of a printing plate wherein the charged particles give the pattern material a polarity;
a second step for rolling a printing roll having a blanket adhered thereto on the printing plate to print the pattern material formed in the plurality of recesses onto the printing roll and to form a predetermined pattern of the pattern material on the printing roll, wherein a voltage of the opposite polarity to the pattern material is applied to the printing roll, and a voltage of the same polarity as the pattern material is applied to the printing plate; and
a third step for rolling the printing roll on a substrate to re-print the predetermined pattern of the printing roll onto the substrate, wherein a voltage of the same polarity as the pattern material is applied to the printing roll, and a voltage of the opposite polarity to the pattern material is applied to the substrate.

16. A patterning method comprising:
a first step for coating a pattern material containing charged particles on a printing plate wherein the charged particles give the pattern material a polarity;
a second step for rolling a printing roll having a plurality of projections and a blanket adhered thereto on the printing plate having the pattern material to form a predetermined shape of the pattern material on the printing roll by printing some pattern material onto the blanket over the projections, wherein a voltage of the opposite polarity to the pattern material is applied to the printing roll, and a voltage of the same polarity as the pattern material is applied to the printing plate; and
a third step for rolling the printing roll on a substrate to re-print the predetermined shape of the pattern material onto the substrate, wherein a voltage of the same polarity as the pattern material is applied to the printing roll, and a voltage of the opposite polarity to the pattern material is applied to the substrate.

* * * * *